US006977728B2

(12) United States Patent  (10) Patent No.: US 6,977,728 B2
Nakauchi  (45) Date of Patent: Dec. 20, 2005

(54) PROJECTION EXPOSURE APPARATUS AND ABERRATION MEASUREMENT METHOD

(75) Inventor: Akihiro Nakauchi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 69 days.

(21) Appl. No.: 10/282,128

(22) Filed: Oct. 29, 2002

(65) Prior Publication Data

US 2003/0086078 A1   May 8, 2003

(30) Foreign Application Priority Data

Nov. 2, 2001 (JP) .............................. 2001-338334

(51) Int. Cl.$^7$ ............................................. G01B 11/00
(52) U.S. Cl. ....................................... 356/399; 355/52
(58) Field of Search ............................... 356/375, 399, 356/400, 401, 121, 122; 355/52, 53; 430/30

(56) References Cited

U.S. PATENT DOCUMENTS

| 5,774,205 | A | | 6/1998 | Sato .......................... 355/67 |
| 5,861,944 | A | * | 1/1999 | Nishi .......................... 355/53 |
| 5,973,316 | A | | 10/1999 | Ebbesen et al. ............. 250/216 |
| 6,329,112 | B1 | * | 12/2001 | Fukuda et al. ........... 356/239.2 |
| 6,333,776 | B1 | * | 12/2001 | Taniguchi .................... 355/52 |
| 6,414,743 | B1 | * | 7/2002 | Nishi et al. ................... 355/53 |
| 6,456,377 | B1 | * | 9/2002 | Suzuki et al. ............... 356/399 |

FOREIGN PATENT DOCUMENTS

JP   11-072607   3/1999

OTHER PUBLICATIONS

Flanders, D.C. and Henry I. Smith. "A new interferometric alignment technique," *Applied Physics Letters*, vol. 31, No. 7, Oct. 1997. pp. 426-428.
Roychoudhuri, C. "Chapter 6: Multiple-Beam Interferometers," *Optical Shop Testing, Second Edition*, Ed. by Daniel Malacara, John Wiley & Sons: 1992. pp. 207-245.
Ojeda-Castañeda, J. "8: Foucault, Wire, and Phase Modulation Tests," *Optical Shop Testing*, John Wiley & Sons, Inc.: 1978. pp. 231-281.
Brown, Max and Emil Wolf, *Principles of Optics, 6th Edition*, "Chapter V, Geometrical Theory of Aberrations" Pergamon Press, 1993. pp. 203-207.

* cited by examiner

*Primary Examiner*—Michael P. Statira
*Assistant Examiner*—Juan D. Valentin, II
(74) *Attorney, Agent, or Firm*—Fitzpatrick, Cella, Harper & Scinto

(57) ABSTRACT

A projection exposure apparatus includes a projection optical system for projecting a pattern on a substrate, a holding portion for holding an optical element which propagates light toward the projection optical system, a mask which is arranged on or near a plane of an image of the optical element formed by the projection optical system and has a transmission portion, an actuator for driving the optical element along one of focal planes of the projection optical system, and a measurement device for measuring an intensity of light which emerges from the optical element, and passes through the projection optical system and the transmission portion of the mask, while the optical element is driven. The measurement device is disposed at a point in a plane conjugate to a pupil plane of the projection optical system or a point in a plane spaced apart from the mask enough to separately detect respective rays emerging from plural points of the plane.

11 Claims, 15 Drawing Sheets

F I G. 11
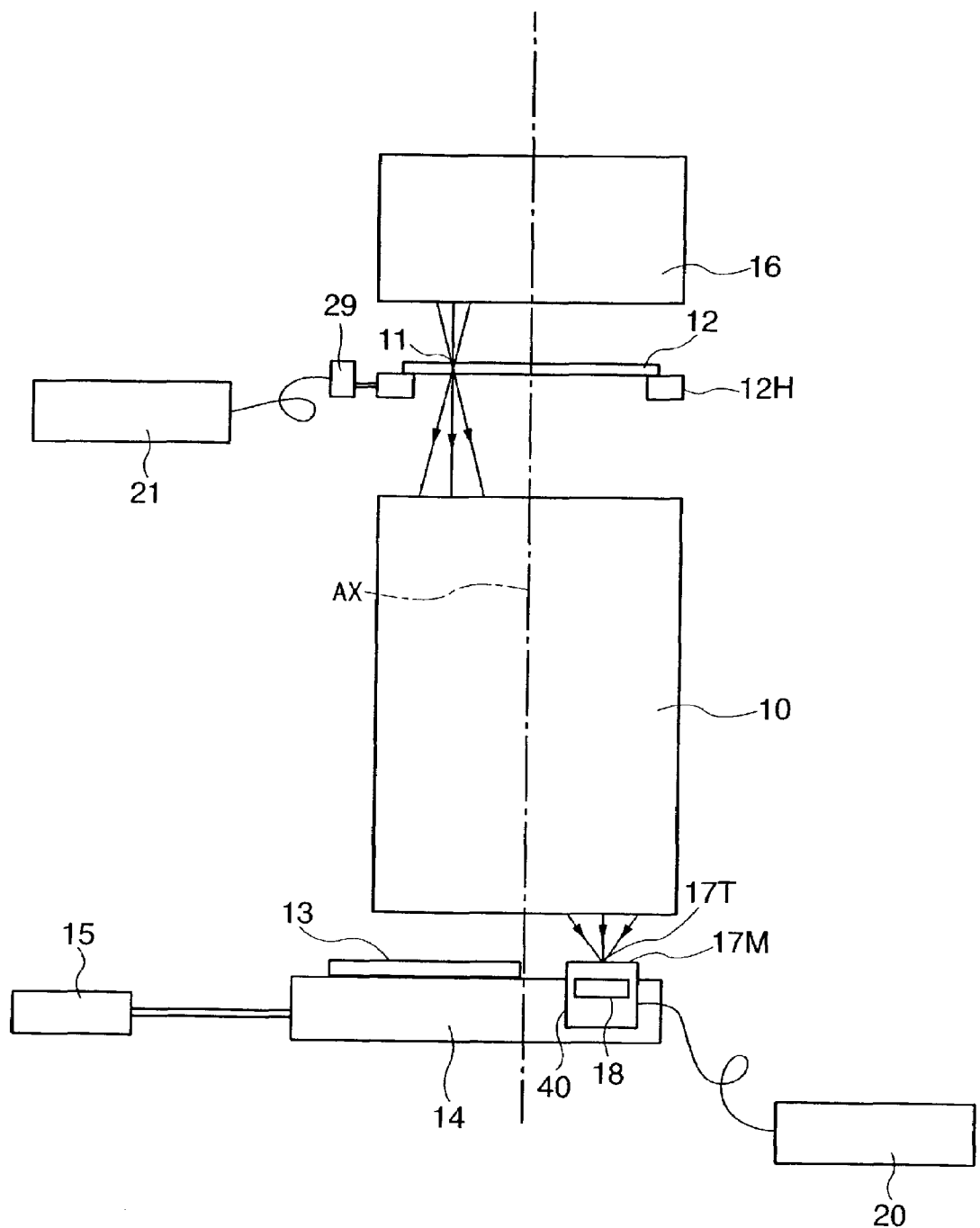

PROJECTION EXPOSURE APPARATUS AND ABERRATION MEASUREMENT METHOD

FIELD OF THE INVENTION

The present invention relates to an exposure apparatus for transferring a pattern on a mask to a photosensitive substrate via a projection optical system. Such an exposure apparatus is used in lithography in manufacturing, e.g., a semiconductor device.

BACKGROUND OF THE INVENTION

The manufacture of a semiconductor devices, or the like, by photolithography uses a projection exposure apparatus for transferring a circuit pattern, or the like, formed on a master (to be referred to as a reticle, hereinafter), such as a reticle or photomask to a semiconductor wafer, or the like, coated with a photosensitive agent. An exposure apparatus of this type must accurately transfer a pattern on a reticle onto a wafer at a predetermined magnification (reduction ratio). To meet this demand, the exposure apparatus must exploit a projection optical system which exhibits good imaging performance and suppresses aberration. In recent years, a pattern exceeding the general imaging performance of an optical system is often transferred along with further miniaturization of a semiconductor device. The transfer pattern, therefore, is more sensitive to the aberration of the optical system than a conventional pattern. On the other hand, the projection optical system must increase the exposure area and numerical aperture (NA), which makes aberration correction more difficult.

In this situation, demands are arising for measuring aberration, particularly wavefront aberration of the projection optical system while the projection optical system is mounted in the exposure apparatus, i.e., is actually used for exposure. This is because measurement of aberration enables more precise lens adjustment corresponding to the use state and device design almost free from the influence of aberration.

To meet these demands, a conventional method is available in which aberration is measured from a change in image intensity distribution along with driving of a knife edge, slit, or the like.

In the method of obtaining the image intensity distribution by a knife edge or slit, the S/N ratio of image intensity distribution measurement must be about $10^6$ or more in a projection optical system used for semiconductor lithography. This value is difficult to achieve.

To obtain wavefront aberration in the method of obtaining the contrast by using a bar chart, the contrasts of many bar charts must be obtained from a rough pitch to a pitch exceeding the resolution limit. This is not practical in terms of the formation of bar charts and measurement labor.

Further, these methods do not allow measurement of wavefront aberration.

As a method of obtaining wavefront aberration, an interferometer is used. However, the interferometer is generally used as an inspection device in the manufacture of a projection optical system, and is not practically mounted in the exposure apparatus in terms of the technique and cost because an interferometer made up of a prism, mirror, lens, and the like, and an interference illumination system having good coherence must be arranged near a reticle stage or wafer stage in the method using the interferometer. In general, the space near the wafer stage or reticle stage is limited, and the sizes of the interferometer and illumination system must therefore be limited. Limitations are also imposed in terms of heat generation and vibration, and the interferometer is difficult to mount. With recent decreases in exposure wavelength, an interferometer light source having good coherence in the exposure wavelength region does not exist or is very expensive. Thus, it is not practical in terms of the technique and cost to mount an interferometer type aberration measurement device in a projection exposure apparatus.

SUMMARY OF THE INVENTION

The present invention has been made in consideration of the above background, and has as its object to provide, e.g., a projection exposure apparatus having a function of measuring the imaging performance (e.g., wavefront aberration) of a projection optical system in a projection exposure apparatus.

According to the first aspect of the present invention, there is provided a projection exposure apparatus comprising a projection optical system for projecting a pattern on a substrate, a holding portion for holding an optical element which propagates light toward the projection optical system, a mask which is arranged near a plane of an image of the optical element formed by the projection optical system and has a transmission portion, an actuator for driving the optical element along one of focal planes of the projection optical system, and a measurement device for measuring an intensity of light which emerges from the optical element, and passes through the projection optical system and the transmission portion of the mask while the optical element is driven.

According to a preferred embodiment of the present invention, the projection exposure apparatus preferably further comprises an arithmetic device for calculating aberration (e.g., ray aberration, wavefront aberration) of the projection optical system on the basis of a measurement result of the measurement device.

According to a preferred embodiment of the present invention, the optical element is preferably arranged near the object-side focal plane of the projection optical system, and the mask is arranged near the image-side focal plane of the projection optical system. Preferably, the optical element includes a mask having a transmission portion, and light emerges toward the projection optical system by illuminating the mask serving as the optical element by an illumination system. Alternatively, the optical element preferably includes a mask having a reflecting portion, and light emerges toward the projection optical system by illuminating the mask serving as the optical element by an illumination system.

According to a preferred embodiment of the present invention, the optical element is preferably arranged near the image-side focal plane of the projection optical system, and the mask is arranged near the object-side focal plane of the projection optical system. Preferably, the optical element includes a mask having a transmission portion, and light emerges toward the projection optical system by illuminating the mask serving as the optical element by an illumination system. Alternatively, the optical element preferably includes a mask having a reflecting portion, and light emerges toward the projection optical system by illuminating the mask serving as the optical element by an illumination system.

According to a preferred embodiment of the present invention, a region of the optical element, from which light emerges, is preferably smaller than an isoplanatic region of the projection optical system.

According to a preferred embodiment of the present invention, light which emerges from the projection optical system preferably sufficiently covers a pupil of the projection optical system.

According to the second aspect of the present invention, there is provided a method of measuring aberration of a projection optical system in a projection exposure apparatus for projecting a pattern on a substrate via the projection optical system, the projection exposure apparatus having a projection optical system for projecting a pattern on a substrate, a holding portion for holding an optical element which propagates light toward the projection optical system, and a mask which is arranged near a plane of an image of the optical element formed by the projection optical system and has a transmission portion, the method comprising the measurement step of measuring an intensity of light which emerges from the optical element, and passes through the projection optical system and the transmission portion of the mask while the optical element is driven along one of focal planes of the projection optical system, and the arithmetic step of calculating aberration of the projection optical system on the basis of a measurement result obtained in the measurement step.

According to the third aspect of the present invention, there is provided a method of transferring a pattern to a substrate by using a projection exposure apparatus, the projection exposure apparatus having a projection optical system for projecting a pattern on a substrate, a holding portion for holding an optical element which propagates light toward the projection optical system, and a mask which is arranged near a plane of an image of the optical element formed by the projection optical system and has a transmission portion, the method comprising the measurement step of measuring an intensity of light which emerges from the optical element, and passes through the projection optical system and the transmission portion of the mask while the optical element is driven along one of focal planes of the projection optical system, the arithmetic step of calculating aberration of the projection optical system on the basis of a measurement result obtained in the measurement step, the adjustment step of adjusting the projection optical system on the basis of wavefront aberration obtained in the arithmetic step, and the transfer step of transferring a pattern to the substrate by using the projection exposure apparatus in which the projection optical system is adjusted.

According to the fourth aspect of the present invention, there is provided a method of manufacturing a device by using a projection exposure apparatus, the projection exposure apparatus having a projection optical system for projecting a pattern on a substrate, a holding portion for holding an optical element which propagates light toward the projection optical system, and a mask which is arranged near a plane of an image of the optical element formed by the projection optical system and has a transmission portion, the method comprising the measurement step of measuring an intensity of light which emerges from the optical element, and passes through the projection optical system and the transmission portion of the mask while the optical element is driven along one of focal planes of the projection optical system, the arithmetic step of calculating aberration of the projection optical system on the basis of a measurement result obtained in the measurement step, the adjustment step of adjusting the projection optical system on the basis of the aberration obtained in the arithmetic step, the transfer step of transferring a pattern to a photosensitive member of the substrate coated with the photosensitive member by using the projection exposure apparatus in which the projection optical system is adjusted, and the developing step of developing the photosensitive member bearing the pattern.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 11 is a view showing the schematic arrangement of a projection exposure apparatus according to the second embodiment of the present invention;

DETAILED DESCRIPTION OF THE PREFERRED EMBODIMENTS

The principle utilized in the present invention will be explained. The present invention is based on the principle adopted in, e.g., the Foucault test, wire test, phase modulation test, and Ronchi test (see, e.g., J. Ojeda-Castaneda, "Optical Shop testing", John Wiley & Sons, Inc., Chapter 8, "Foucault, Wire and Phase Modulation Tests," pages 231–281 (1978)).

In general, a beam coming from a point object converges to one imaging point in an ideal projection optical system free from any aberration, but does not converge to one point in the presence of aberration.

Figure 1:
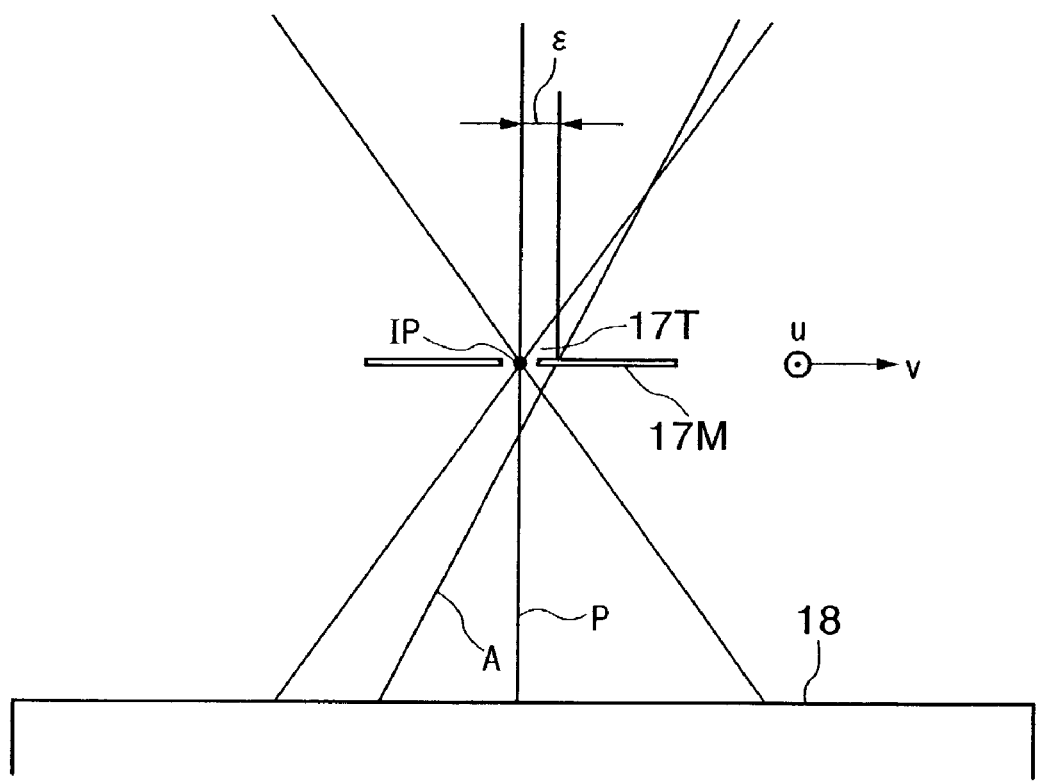
FIG. 1 is a view showing the optical path of a ray A which deviates from an ideal imaging point IP of an optical system with aberration.

FIG. 1 shows the state of a beam near the imaging point. In FIG. 1, a ray A which is emitted by an illumination system (not shown), passes through a transmission portion regarded as a point object formed on a mask as an optical element (not shown), and passes through a projection optical system (not shown), deviates from an ideal imaging point IP. A mask 17M having a transmission portion 17T, and a light intensity distribution detection device 18 for measuring the light intensity distribution of a beam having passed through the transmission portion 17T are arranged near the imaging point.

Let coordinates (u,v) be the position of the transmission portion 17T on a plane perpendicular to the optical axis (not shown; vertical direction in FIG. 1) of the projection optical system, and coordinates (x,y) be the position on the light intensity measurement surface of the light intensity distribution detection device 18. The position on the light intensity measurement surface of the light intensity distribution detection device 18 is in one-to-one correspondence with the position on the exit pupil of the projection optical system. This can be realized by separating the light intensity distribution detection device 18 from the image-side focal position of the projection optical system by a certain distance, or arranging an optical system which conjugates the position on the light intensity measurement surface and the position of the exit pupil of the projection optical system.

In FIG. 1, the ray A deviates from the ideal imaging point IP and is shielded by the non-transmission portion of the mask 17M owing to the aberration of the projection optical system. In this state, the ray A does not reach the light intensity distribution detection device 18, thereby darkening a portion corresponding to the ray A on the measurement surface of the light intensity distribution measurement device 18.

Figure 2:
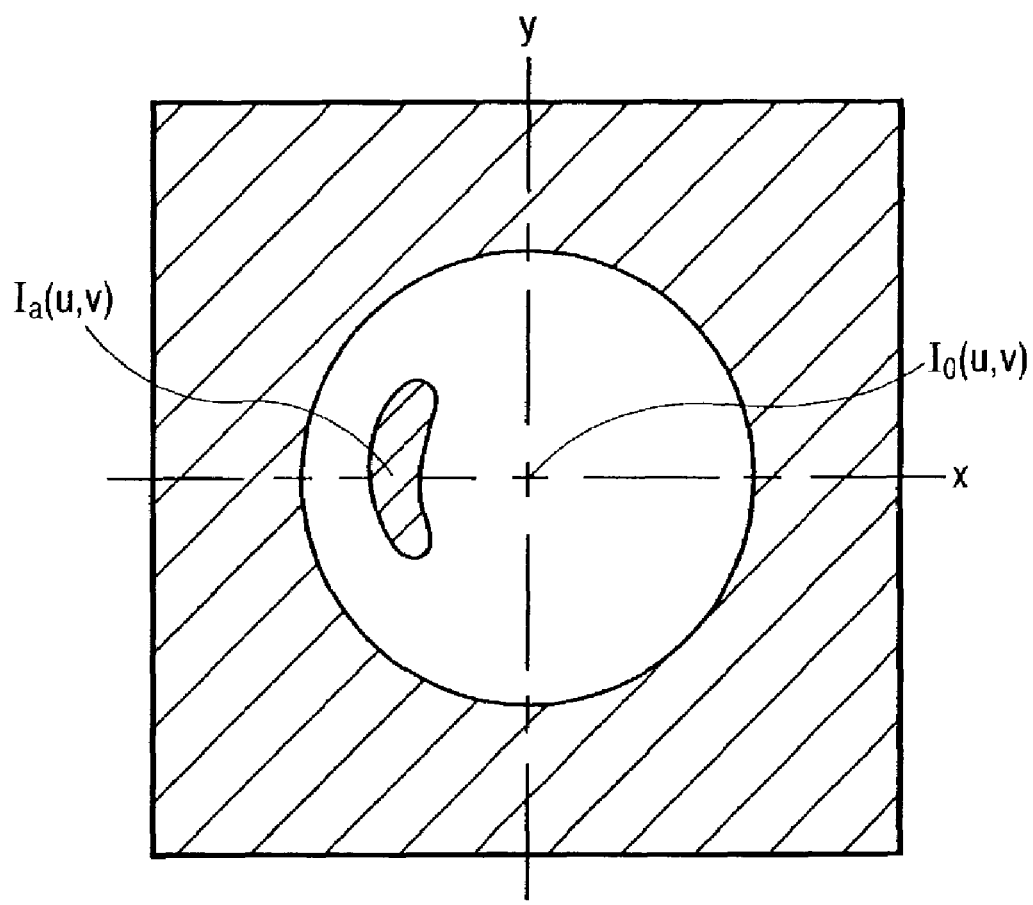
FIG. 2 is a view showing the intensity distribution, of a beam having passed through a transmission portion, on a light intensity distribution measurement device.

FIG. 2 shows the intensity distribution of a beam having passed through the transmission portion 17T on the light intensity distribution detection device 18. $I_0(u,v)$ represents the light intensity of a portion corresponding to a principal ray P when the position of the transmission portion 17T is (u,v), and $I_a(u,v)$ represents the light intensity of a portion corresponding to the ray A when the position of the transmission portion 17T is (u,v). $I_a(u,v)$ is low because the ray A is shielded by the non-transmission portion of the mask 17M.

Letting $(\epsilon, \eta)$ be the ray aberration of the ray A, the light intensity at a portion corresponding to the ray A becomes equal to $I_0(u,v)$:

$$I_a(u,v)=I_0(u-\epsilon, v-\eta)$$

when the transmission portion 17T is moved by $(\epsilon, \eta)$

For this reason, changes in light intensity at respective points on the light intensity distribution detection device 18 are plotted while the position (u,v) of the transmission portion 17T is moved. As a result, a distribution shifted in phase by an amount corresponding to ray aberration (changes in intensity along with movement) can be obtained. This phase shift amount can be obtained to determine ray aberration.

In practice, the mask 17M having the transmission portion 17T is scanned along the u axis to obtain the light intensity distribution at the position of the transmission portion 17T, thereby measuring a transverse aberration amount $\epsilon$ in the u direction. The mask 17M is also scanned along the v axis perpendicular to the u axis to obtain the light intensity distribution at the position of the transmission portion 17T, thereby measuring a transverse aberration amount $\eta$ in the v direction.

Figure 3:
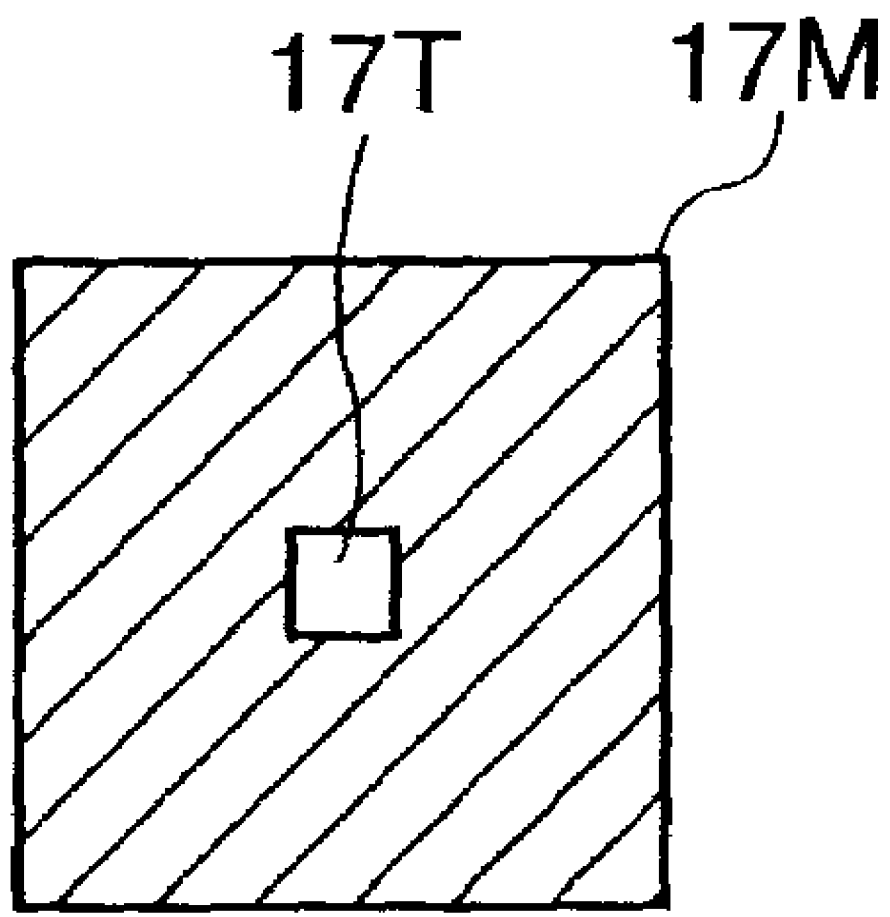
FIG. 3 is a view showing an example of a mask having a transmission portion.

FIG. 3 is a view showing the mask 17M having the transmission portion 17T. A square aperture is formed as the transmission portion (optical element) 17T in a non-transmission substrate.

Figure 4A:
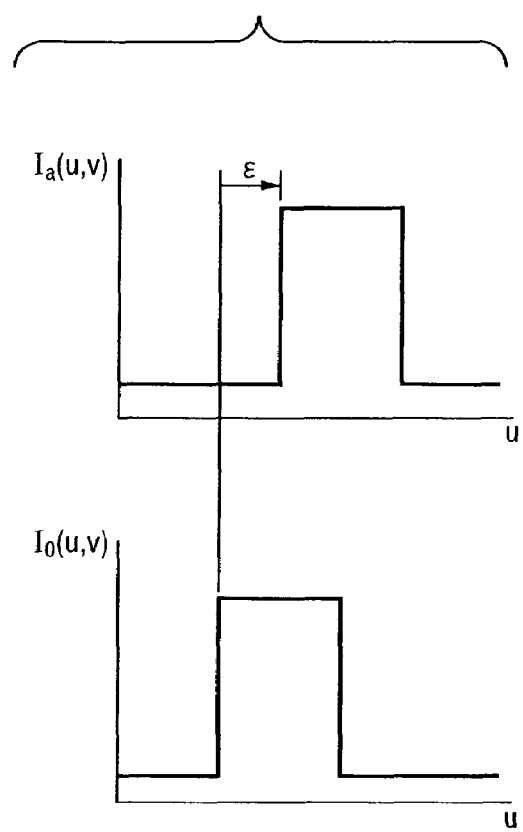
FIGS. 4A and 4B are graphs showing the light intensity distributions of rays A and P along the u and v axes on the measurement surface of the light intensity distribution measurement device.

FIG. 4A is a graph showing the plots of the light intensities $I_a(u,v)$ and $I_0(u,v)$ on the measurement surface of the light intensity distribution detection device 18 along the u axis. In FIG. 4A, the two plots have a phase shift of a ray aberration $\epsilon$ along the u axis.

Figure 4B:
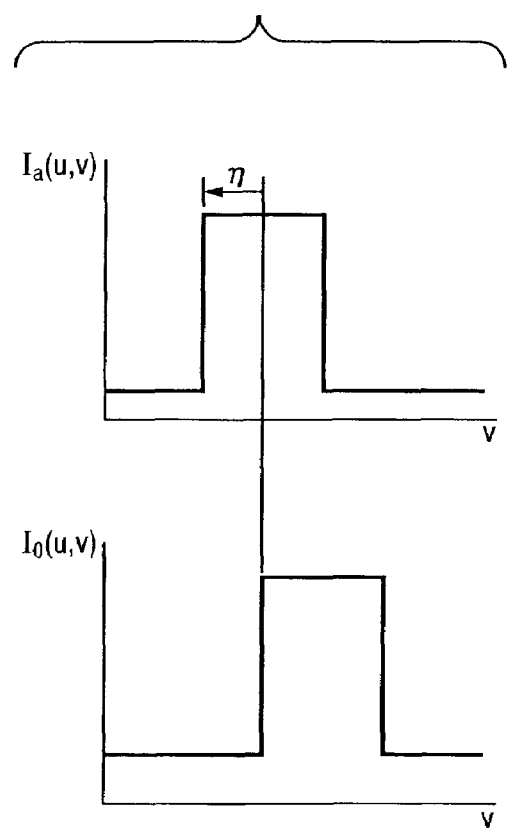

FIG. 4B is a graph showing the plots of the light intensities $I_a(u,v)$ and $I_0(u,v)$ on the measurement surface of the light intensity distribution detection device 18 along the v axis. In FIG. 4B, the two plots have a phase shift of a ray aberration $\eta$ along the v axis.

Since each point (x,y) on the light intensity measurement surface of the light intensity distribution detection device 18 is in one-to-one correspondence with the exit pupil of the projection optical system, as described above, the ray aberration $(\epsilon, \eta)$ is regarded as aberration of a ray having passed through the point (x,y) on the exit pupil.

In the above description, the transmission mask arranged between the illumination system and the projection optical system is regarded as a point object. If the transmission portion of the transmission mask is an object smaller than the isoplanatic region of the projection optical system, the transmission portion need not be so small as to be regarded as a point object. In the isoplanatic region, aberration is regarded to be equal throughout this region. Imaging beams with the same aberration that pass through respective points of the first transmission portion are superimposed into the image of the first transmission portion. The plot obtained by scanning the image of the first transmission portion at the second transmission portion 17T has a distribution obtained by superimposing by the size of the second pattern image the plots in which the first transmission portion is regarded as a point object.

Figure 5:
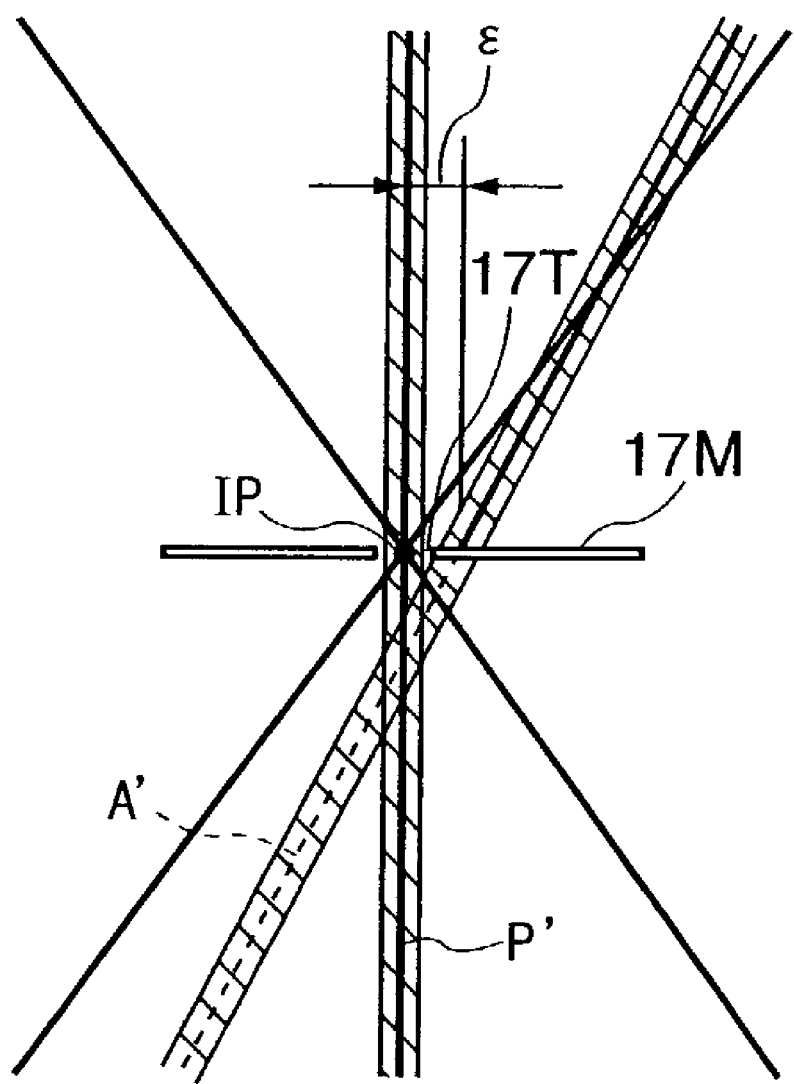
FIG. 5 is a view for explaining a beam near the imaging point IP when the transmission portion is a square aperture in an isoplanatic region.

FIG. 5 shows a beam near the imaging point of the projection optical system when the first transmission portion arranged between the illumination system and the projection optical system is a square aperture in the isoplanatic region. A' represents a beam corresponding to the ray A; and P', a beam corresponding to the principal ray P. The sections of the two beams are squares equal in size because of the isoplanatic region, and the beam A' deviates from the beam P' by the aberration $(\epsilon, \eta)$ of the ray A. Let $I'_0(u, v)$ be the light intensity of a portion corresponding to the beam P' when the position of the transmission portion 17T is (u, v), and $I'_a(u,v)$ be the light intensity of a portion corresponding to the beam A'. Then, as is apparent from FIGS. 6A and 6B, we have $$I'_a(u,v)=I'_0(u-\epsilon,v-\eta).$$

Changes in light intensity at respective points of the light intensity measurement surface on the light intensity distribution detection device 18 are plotted while the position (u,v) of the transmission portion 17T is moved. Consequently, a distribution shifted in phase by an amount corresponding to ray aberration (changes along with movement)

can be obtained. This phase shift amount can be obtained to determine ray aberration. The transmission portion 17T is the same as that shown in FIG. 3.

Figure 6A:
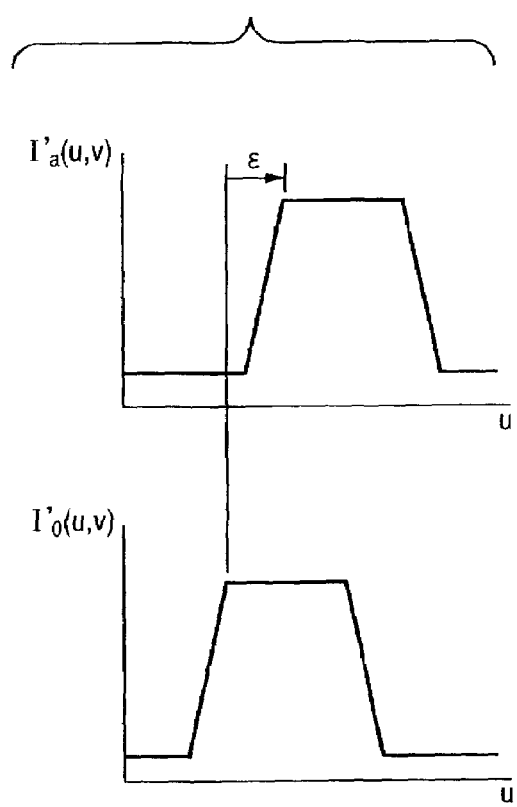
FIGS. 6A and 6B are graphs showing the light intensity distributions of beams A' and P' shown in FIG. 5 along the u and v axes on the measurement surface of the light intensity distribution measurement device.

FIG. 6A is a graph showing the plots of the light intensities $I'_a(u,v)$ and $I'_0(u,v)$ on the measurement surface of the light intensity distribution detection device 18 along the u axis. In FIG. 6A, the two plots have a phase shift of the ray aberration $\epsilon$ along the u axis.

Figure 6B:
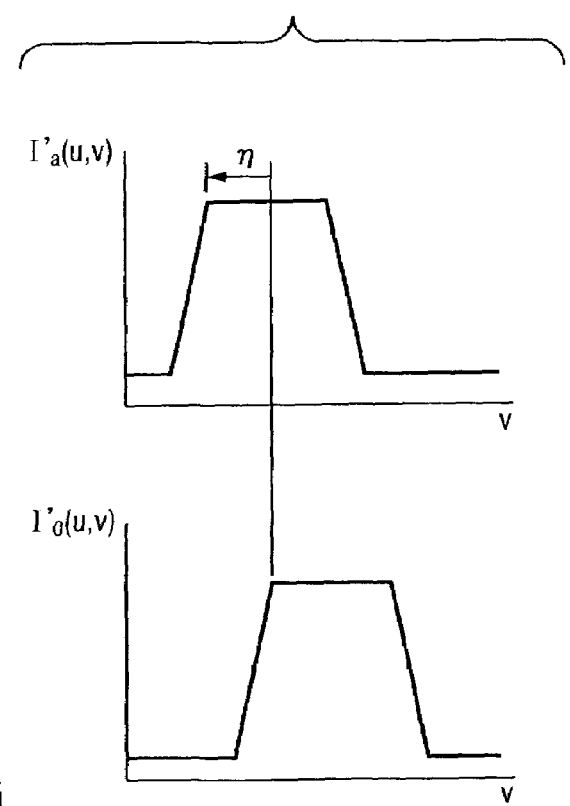

FIG. 6B is a graph showing the plots of the light intensities $I'_a(u,v)$ and $I'_0(u,v)$ on the measurement surface of the light intensity distribution detection device 18 along the v axis. In FIG. 6B, the two plots have a phase shift of the ray aberration $\eta$ along the v axis.

From this, if the first transmission portion is smaller than the isoplanatic region, the ray aberration $(\epsilon, \eta)$ can be obtained similarly to a case wherein the first transmission portion is regarded as a point object.

Letting R' be as the optical length between the position where the imaging beam crosses the reference sphere and the position where the imaging beam crosses the imaging plane, wavefront aberration $\phi$ and the ray aberration $(\epsilon, \eta)$ satisfy $$\varepsilon(x, y) = R' \frac{\partial \phi}{\partial x} \quad (1)$$

$$\eta(x, y) = R' \frac{\partial \phi}{\partial y} \quad (2)$$

The wavefront aberration $\phi$ is obtained by the above equations. Such equations are described in, e.g., Max Brown, Emill Wolf "Principles of Optics 6$^{th}$ Edition", Chapter V, "*Geometrical Theory of Aberrations,*" pages 230–207, Pergamon Press, 1993.

Figure 7:
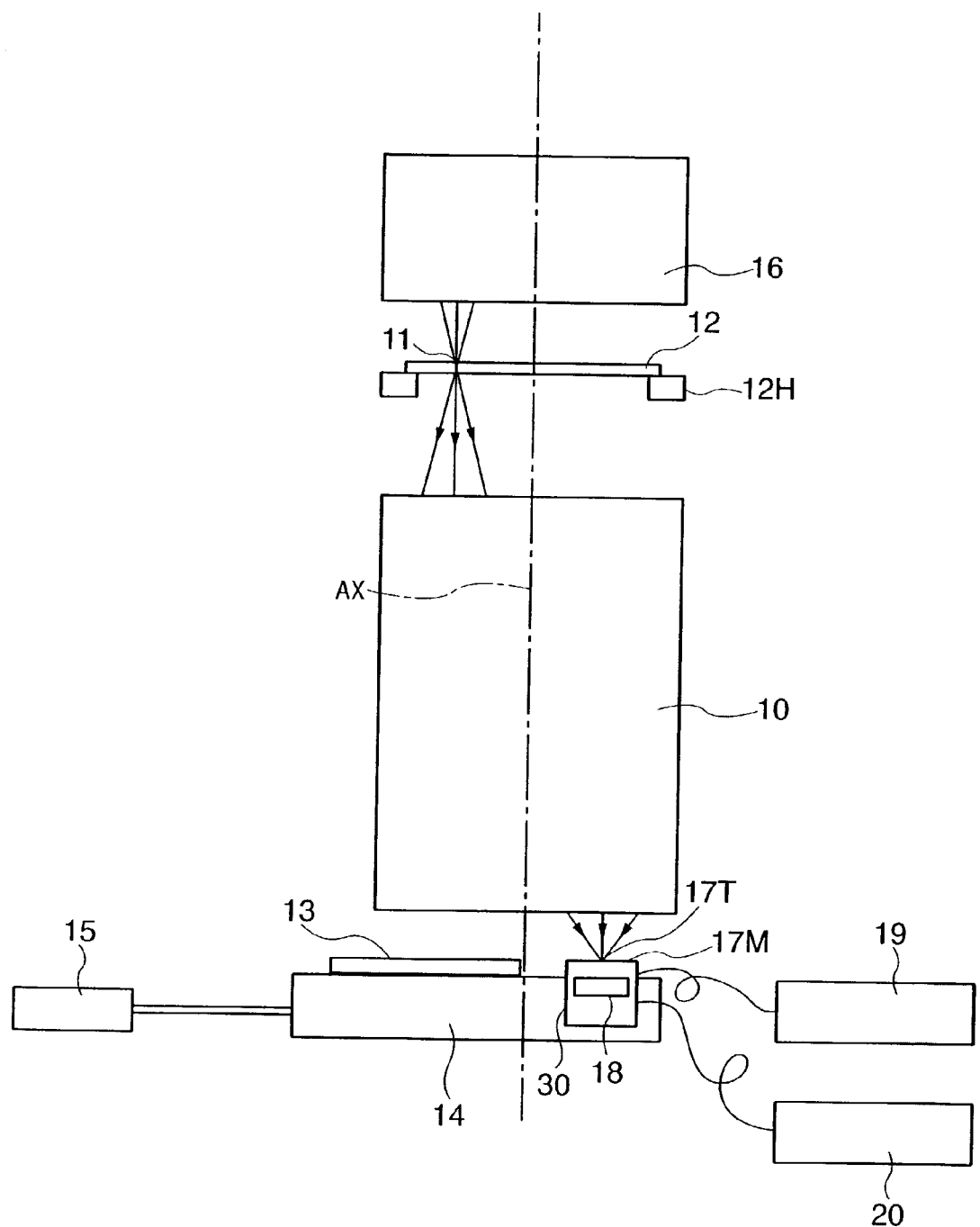
FIG. 7 is a view showing the schematic arrangement of a projection exposure apparatus according to the first embodiment of the present invention.

FIG. 7 shows the arrangement of a projection exposure apparatus according to a preferred embodiment of the present invention. A beam emitted by an illumination system 16 passes through a first transmission portion 11 formed in a mask 12. The beam forms the image of the first transmission portion 11 via a projection optical system 10. The imaging beam passes through the second transmission portion 17T arranged near the imaging position of the image of the first transmission portion 11, and reaches the measurement surface of a light intensity distribution detection device 18 where the light intensity distribution is measured. A measurement unit 30 comprised of the second mask 17M having the second transmission portion 17T, the light intensity distribution detection device 18, and the like, is mounted on a wafer stage 14. The second transmission portion 17T is aligned near the imaging position of the first transmission portion 11.

A driving device 15 drives the wafer stage 14, on which a wafer chuck 13 is fixed. A controller 20 controls an actuator to perform scan driving for the second mask 17M having the second transmission portion 17T along the image plane (image-side focal plane) of the projection optical system 10. A signal processor 20 processes a light intensity signal (light intensity distribution) which is detected by the light intensity distribution detection device 18.

A beam emitted by the illumination system 16 is assumed to sufficiently cover the entrance pupil of the projection optical system 10 after it passes through the first transmission portion 11. This is realized by adopting an illumination system with a $\sigma=1$ as the illumination system 16.

The first transmission portion 11 is smaller than the isoplanatic region of the projection optical system 10. For the projection system of a semiconductor exposure apparatus, several percent of the screen size is regarded as an isoplanatic region. For a semiconductor exposure apparatus using a six inch mask, the first transmission portion 11 is limited to below several mm in size.

Figure 8:
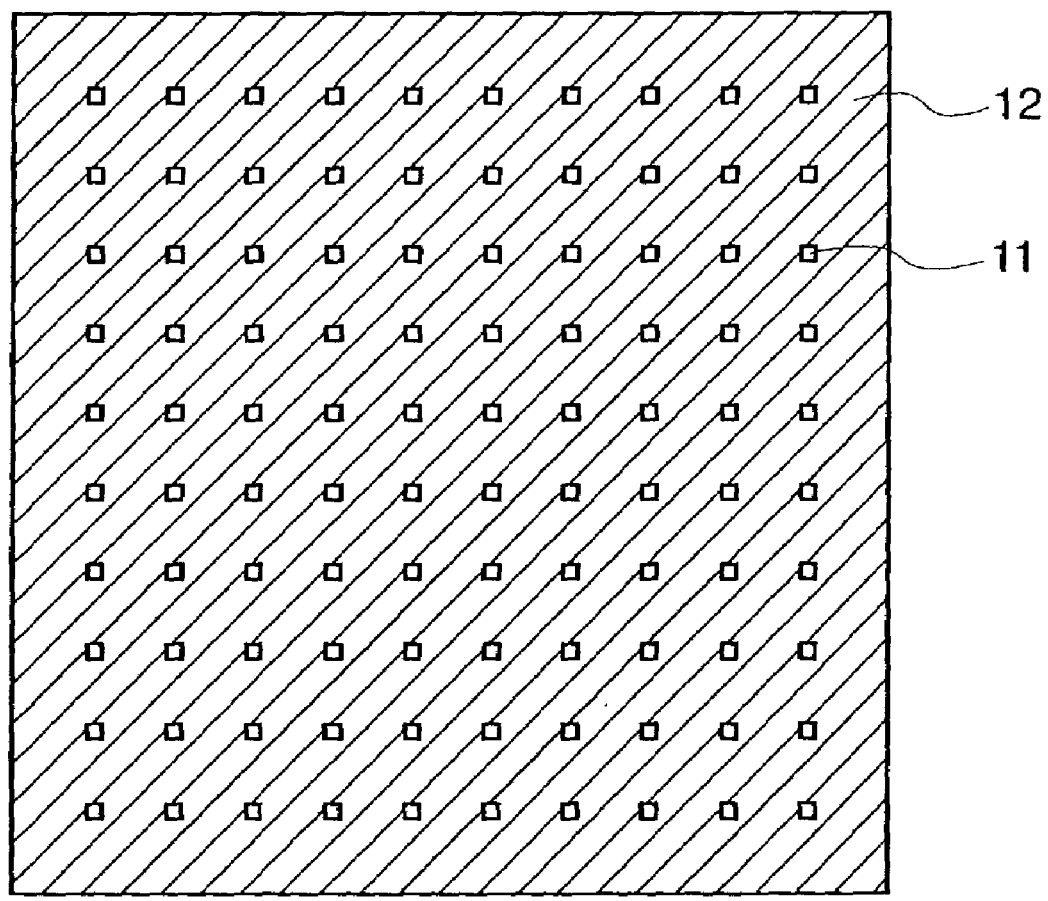
FIG. 8 is a view showing an example in which rectangular apertures are arrayed in a matrix as a transmission portion.

FIG. 8 shows an example in which rectangular apertures are arrayed as the first transmission portions 11 in a 10×10 matrix in the mask 12. The imaging performance can be measured at a plurality of image points by arraying the plurality of first transmission portions 11 and measuring the imaging performance at the respective imaging positions.

Figure 9:
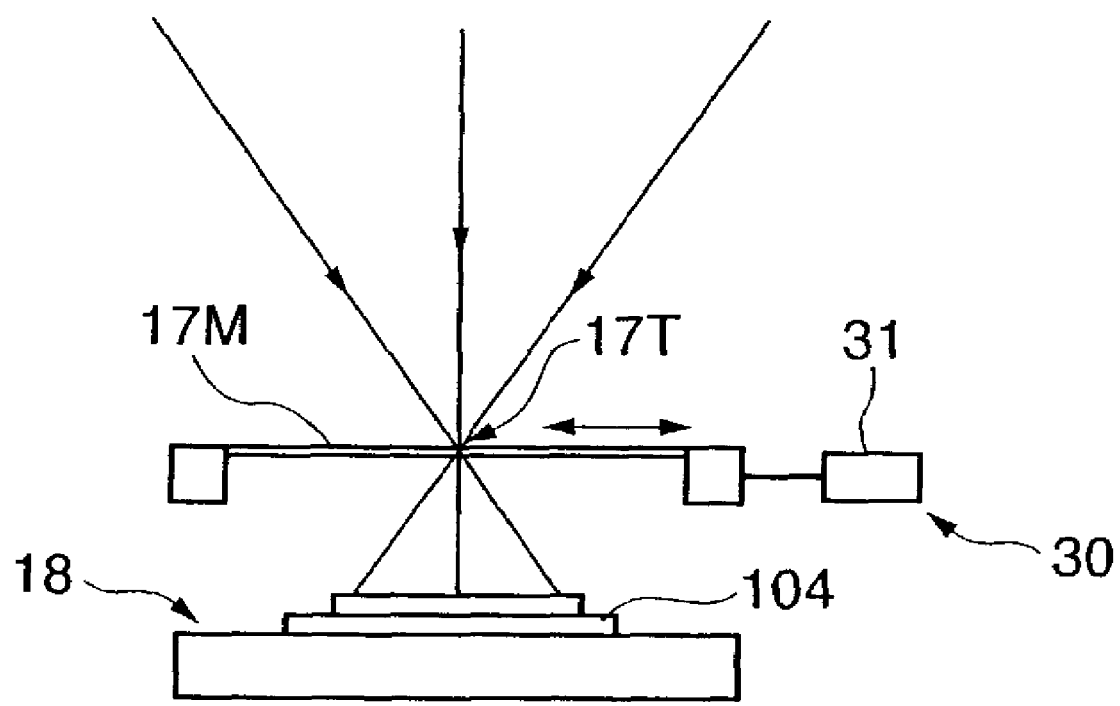
FIG. 9 is a partial enlarged view showing the transmission portion and a portion of the light intensity distribution measurement device.

The measurement unit 30, which includes the second mask 17M having the second transmission portion 17T, light intensity distribution detection device 18, and the like, is aligned by the wafer stage 14, so as to locate the second transmission portion 17T near the imaging position of the first transmission portion 11. A position on the light intensity measurement surface of the light intensity distribution detection device 18 has a margin to such a degree as to ensure one-to-one correspondence with a position on the exit pupil of the projection optical system 10. This can be realized by, e.g., separating an image sensing element 104 of the light intensity distribution detection device 18 from the imaging position of the projection optical system 10 by a certain distance, as shown in FIG. 9. This can also be realized by using a pupil imaging optical system for conjugating the pupil of the projection optical system 10 and the image sensing surface.

In this state, an actuator 31 in FIG. 9 performs scan driving for the second transmission portion 17T along the image plane of the projection optical system 10. The signal processor 20 processes changes in light intensity detected at the respective light-receiving units of the image sensing element 104 of the light intensity distribution detection device 18 with respect to the position of the second transmission portion 17T on the basis of the principle described with reference to FIGS. 3, 4, 5 and 6. As a result, ray aberration $(\epsilon(x,y), \eta(x,y))$ can be obtained.

Wavefront aberration $\phi$ is calculated from the obtained ray aberration on the basis of equations (1) and (2) described above.

Letting D be the width of the second transmission portion 17, t be the width of the first transmission portion (rectangular aperture) 11 shown in FIG. 8 to be projected by the projection optical system 10, and m be the magnification of the projection optical system 10, the light intensities $I'_a(u,v)$ and $I'_0(u,v)$ with respect to the position of the second transmission portion 17T shown in FIGS. 6A and 6B are measured for a section with a length represented by:

$$L = D + t \times m.$$

The light intensity distribution is shifted as a whole in the lateral direction by the aberration amount of the projection optical system 10. For this reason, letting $\xi$max be the maximum value of transverse aberration to be measured, a scanning distance S has a value, at the minimum, represented by:

$$S = L + 2 \times \xi\text{max}$$

$$D + t \times m + 2 \times \xi\text{max}.$$

ξmax is multiplied by 2 to deal with the positive and negative signs of a transverse aberration amount.

Letting ξmin be the measurement precision of a transverse aberration amount to be measured, a scanning precision ΔS must have a value not more than:

ΔS=ξmin.

The measurement precision ξmin also decreases due to a measurement-precision decreasing factor other than the scanning precision. Though the scanning precision ΔS cannot be determined without assigning precisions to the respective elements, it is assumed to be almost the same as the measurement precision in the following description for the sake of simplicity.

For example, assuming that the width t of the first transmission portion (rectangular aperture) 11 to be projected is 100 μm, the magnification m of the projection optical system is ¼, the width D of the second transmission portion 17T is the same as that of a projected image of the first transmission portion 11, i.e., 25 μm (100 μm/4), and the measurement precision ξmin of the transverse aberration amount is 10 nm, the scanning precision is given by:

ΔS=10 nm.

This transverse aberration amount ξmin corresponds to a value of 10 mλ of the fourth spherical aberration where a wavelength to be used is 193 nm, and the image-side numerical aperture of the projection optical system 10 is 0.8.

Letting NAi be the image-side numerical aperture of the projection optical system, a stationary precision ΔZ must have a value not more than:

ΔZ=ξmin/NAi.

Similarly to the scanning precision, the measurement precision ξmin decreases due to a measurement-precision decreasing factor other than the stationary precision ΔZ. Though the stationary precision ΔZ cannot be determined without assigning precisions to the respective elements, it is assumed to be almost the same as the measurement precision for the sake of simplicity.

The stationary precision in a direction perpendicular to the scanning direction is calculated using the same value as the estimated scanning precision as follows:

ΔZ=10 nm/0.8=12.5 nm.

In the embodiment described above, the scanning precision of the second transmission portion 17T and the stationary precision in a direction perpendicular to the scanning direction must meet strict requirements, i.e., have values not more than the transverse aberration measurement precision. With a further decrease in wavelength to be used of the projection optical system 10, and an approximation to 1 of the numerical aperture of the projection optical system 10, precisions on the order of nanometers will be required in the future. It is difficult to implement devices with such precisions.

In each of the following embodiments, a measurement method and apparatus in which the scanning precision of a transmission portion or mask having the portion formed therein is decreased are disclosed to solve the above-described problem.

[Second Embodiment]

FIG. 11 shows the arrangement of a projection exposure apparatus according to the second embodiment of the present invention. A beam emitted by an illumination system 16 passes through a first transmission portion 11 formed in a mask 12. The beam forms the image of the first transmission portion 11 via a projection optical system 10. The imaging beam passes through the second transmission portion 17T arranged near the imaging position of the first transmission portion 11, and reaches the measurement surface of a light intensity distribution detection device 18 where the light intensity distribution is measured. A measurement unit 40 comprised of the second mask 17M having the second transmission portion 17T, the light intensity distribution detection device 18, and the like, is mounted on a wafer stage 14. The second transmission portion 17T is aligned near the imaging position of the first transmission portion 11. A driving device 15 drives the wafer stage 14, on which a wafer chuck 13 is fixed.

The mask 12 having the first transmission portion 11 is held by a mask holder 12H. The projection exposure apparatus has an actuator 29 for scanning the first transmission portion 11 along the object plane (object-side focal plane) of the projection optical system 10 by driving the mask holder 12H.

A signal processor 20 processes a light intensity signal (light intensity distribution), which is detected by the light intensity distribution detection device 18, thereby obtaining the aberration of the projection optical system 10.

A beam emitted by the illumination system 16 is assumed to sufficiently cover the entrance pupil of the projection optical system 10 after it passes through the first transmission portion 11. This is realized by adopting an illumination system with a σ=1 as the illumination system 16.

The first transmission portion 11 is smaller than the isoplanatic region of the projection optical system 10. For the projection system of a semiconductor exposure apparatus, several percent or less of the screen size is regarded as an isoplanatic region. For a semiconductor exposure apparatus using a six inch mask, the first transmission portion 11 is limited to below several mm in size.

FIG. 8 shows an example in which rectangular apertures are arrayed as the first transmission portions 11 in a 10×10 matrix in the mask 12. The imaging performance can be measured at a plurality of image points by arraying the plurality of first transmission portions 11 and measuring the imaging performance at the respective imaging positions.

A measurement unit 40 comprised of the second mask 17M having the second transmission portion 17T, the light intensity distribution detection device 18, and the like, is mounted on a wafer stage 14. The second transmission portion 17T is aligned near the imaging position of the first transmission portion 11. The light intensity measurement surface of the light intensity distribution detection device 18 is arranged so as to ensure one-to-one correspondence with the exit pupil of the projection optical system 10.

Figure 10:
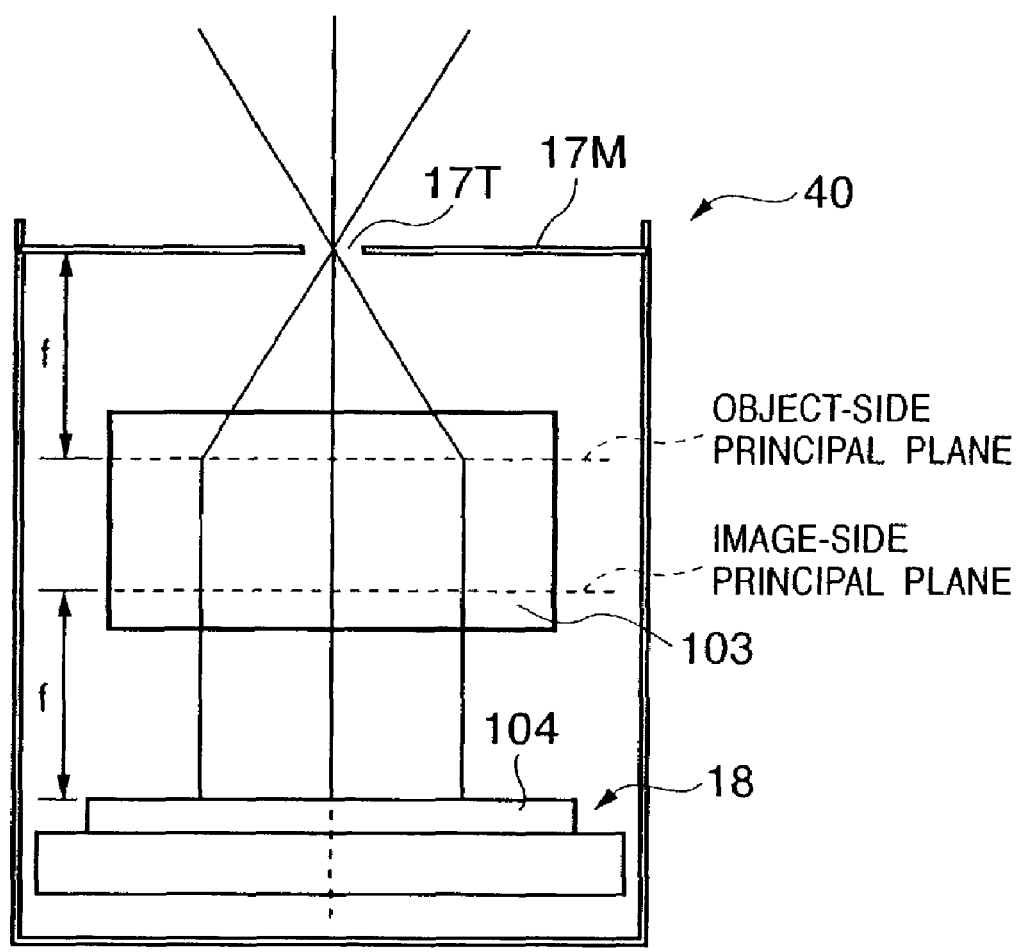
FIG. 10 is a view for explaining the arrangement of a measurement unit in which a pupil conjugate optical system is disposed between the transmission portion and a light image sensing system.

FIG. 10 shows the schematic arrangement of the measurement unit 40. The measurement unit 40 is comprised of the second mask 17M having the second transmission portion 17T, a pupil imaging optical system 103, the light intensity distribution detection device 18 having a two-dimensional solid-state image sensing element, and the like. The pupil imaging optical system 103 is a collimator lens having a focal length f and is arranged such that the object-side focal plane and image-side focal plane are respectively located on the second mask 17M and light-receiving surface of the two-dimensional solid-state image sensing element 104. With this arrangement, the two-dimensional solid-state image sensing element 104 is conjugate to the exit pupil of the projection optical system 10.

In this state, the actuator 29 scans the mask 12 having the first transmission portion 11 along the object plane of the projection optical system 10, and at the same time a moving amount monitor 21 monitors the moving amount of the mask 12. A reticle moving mechanism of a reticle stage (not shown) and measurement device for reticle moving amounts (not shown) may respectively be employed as the actuator 29 and moving amount monitor 21. Alternatively, the actuator 29 and moving amount monitor 21 may be provided separately.

As scan of the mask 12 advances, an image of the first transmission portion 11, which is formed via the projection optical system 10, moves along the image plane on the second mask 17M.

Figure 12:
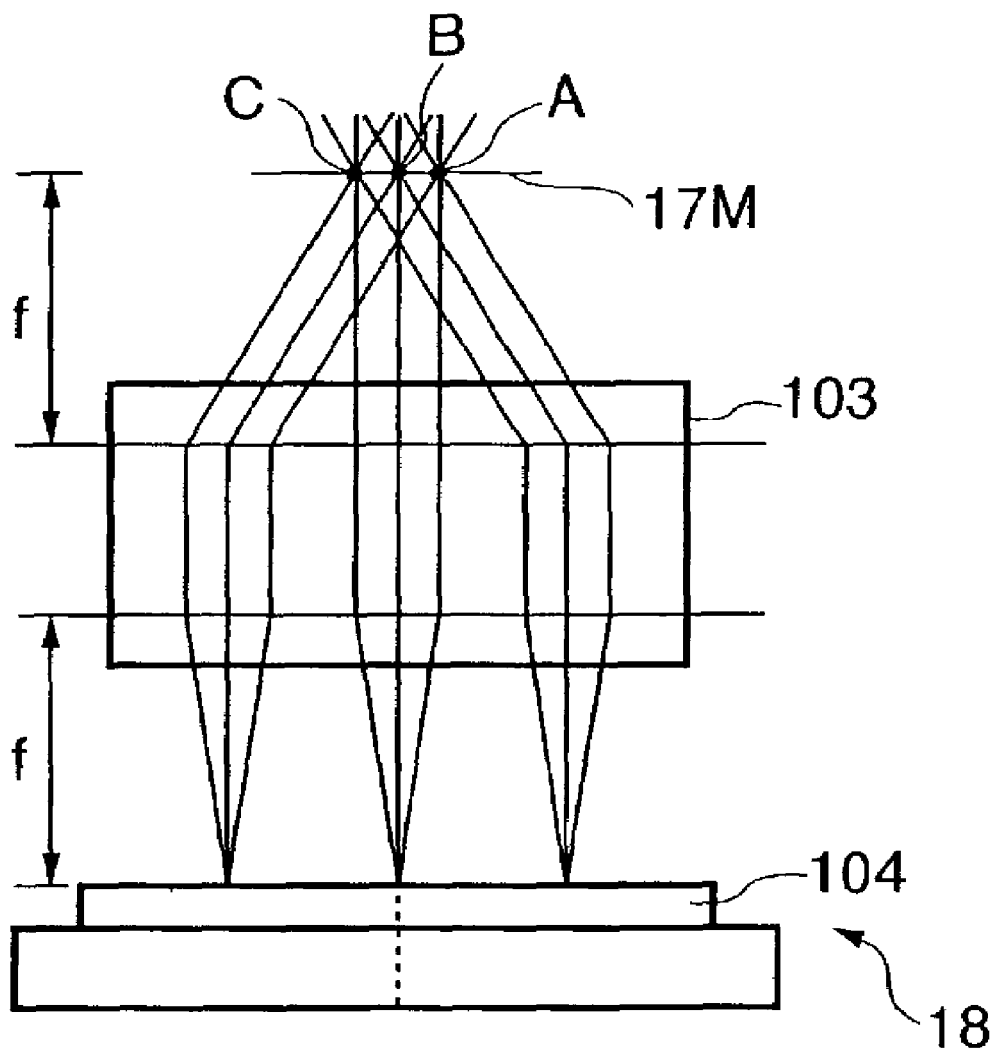
FIG. 12 is a view for explaining how an image is projected to an image sensing portion via the exit pupil conjugate optical system of a projection optical system.

FIG. 12 shows the state at this time. Note that the first transmission portion 11 is not illustrated in FIG. 12.

When the first transmission portion 11 is scanned from left to right with respect to the sheet surface of FIG. 12, the imaging point of the first transmission portion 11, which has originally been at a position A, moves from A to C via B from right to left with respect to the sheet surface. The object-side focal plane of the pupil imaging optical system 103 coincides with the position of the second mask 17M; and the image-side focal plane of the pupil imaging optical system 103, coincides with the position of the light-receiving surface of the two-dimensional solid-state image-sensing element 104. Accordingly, the position of the image of the exit pupil of the projection optical system 10, which is formed on the two-dimensional solid-state image sensing element 104, does not change even if the image of the first transmission portion 11 moves on the second mask 17M. The image of a given point on the exit pupil is always formed on a corresponding point on the two-dimensional solid-state image sensing element 104.

In the first embodiment, the second transmission portion 17T is-scanned while the first transmission portion 11 is fixed. However, in this embodiment, the first transmission portion 11 is scanned while the second transmission portion 17T is fixed, thereby obtaining the light intensity distribution in the same manner as in the first embodiment. The signal processor 20 processes changes in light intensity (light intensity distribution) at the respective light-receiving units of the two-dimensional solid-state image sensing element 104 of the light intensity distribution detection device 18 with respect to the position of the first transmission portion 11 on the basis of the principle described with reference to FIGS. 3, 4, 5 and 6. As a result, ray aberration ($\epsilon$ (x,y), $\eta$(x,y)) can be obtained.

The wavefront aberration $\phi$ can be obtained by processing the obtained ray aberration by the signal processor 20 on the basis of the above-described equations (1) and (2).

The mark 12 is moved to shift the position of the first transmission portion 11 to a different exposure area, and the measurement unit 40 is so driven as to locate the second transmission portion 17T at the imaging point of the first transmission portion 11. In this state, the same measurement as described above can obtain the ray aberration and wavefront aberration in the entire exposure area of the projection optical system 10.

This embodiment has an advantage over the first embodiment in scanning precision.

In the first embodiment, the second transmission portion 17T is to be scanned, and thus the second transmission portion 17T must have a scanning precision almost equal to or higher than the measurement precision $\xi$min.

On the other hand, in this embodiment, the second transmission portion 17T remains stationary, and the first transmission portion 11 located on the object plane of the projection optical system 10 is scanned. Consequently, a scanning precision required can be decreased by a factor of the magnification m of the projection optical system 10. That is, the required scanning precision $\Delta S'$ of the first transmission portion 11 is given by:

$$\Delta S' = \xi \min / m.$$

Assuming that the transverse aberration measurement precision is 10 nm, and the magnification of the projection optical system is ¼, the scanning precision $\Delta S'$ is calculated as follows:

$$\Delta S' = 10 \text{ nm}/(¼) = 40 \text{ nm}.$$

The scanning precision of the first transmission portion 11 may be one-fourth the scanning precision of the second transmission portion 17T in the first embodiment.

Assuming that the transverse aberration measurement precision is 10 nm, and the magnification of the projection optical system is ¼, the scanning precision $\Delta S'$ is calculated as follows:

$$\Delta S' = 10 \text{ nm}/(¼) = 40 \text{ nm}$$

The scanning precision of the first transmission portion 11 may be one-fourth the scanning precision of the second transmission portion 17T in the first embodiment.

The stationary precision $\Delta Z'$ in a direction perpendicular to the scanning direction of the first transmission portion 11 is equal to a value obtained by decreasing the stationary precision $\Delta Z$ required in the first embodiment by a factor of the vertical magnification and is given by:

$$\Delta Z'/\Delta Z = (1/m)^2.$$

More specifically, if the magnification of the projection optical system 10 is ¼, scanning can be performed at a precision which is one-sixteenth the value of the stationary precision $\Delta Z$. In the first embodiment, if the numerical aperture NAi is 0.8, $\Delta Z = 12.5$ nm. On the other hand, in this embodiment, the scanning precision $\Delta Z'$ is very low, as follows:

$$\Delta Z' = 200 \text{ nm}.$$

In this embodiment, the pupil imaging optical system 103 as shown in FIG. 10 is employed as a measurement unit for the light intensity distribution. However, even if a pupil conjugate optical system is omitted, the light intensity distribution detection device 18 is separated from the second transmission portion 17T by a sufficient distance, and scan driving is performed for the first transmission portion 11 while the second transmission portion 17T and light intensity distribution detection device 18 are fixed, the same effect can be obtained. This arrangement is obtained by omitting an actuator 31 from the arrangement shown in FIG. 9. The distance between the second transmission portion 17T and the light intensity distribution detection device 18 is desirably set to satisfy a so-called far-field relationship, i.e., to several mm to several tens of mm. For example, assume that the distance between the second transmission portion 17T and the light intensity distribution detection device 18 is 50 nm. In this case, when the aperture width of the first transmission portion 11 is 100 $\mu$m, the projection system magnification is ¼, and the numerical aperture is 0.8, the size of the image of the first transmission portion 11 is $\phi 25$ $\mu$m, the size of the exit pupil of the projection optical system 10 to be projected to the light intensity distribution detection device 18 is $\phi 133$ $\mu$m, and the ratio of the size of the pupil to the image of the first transmission portion 11 is as large as 5,320.

Figure 13:
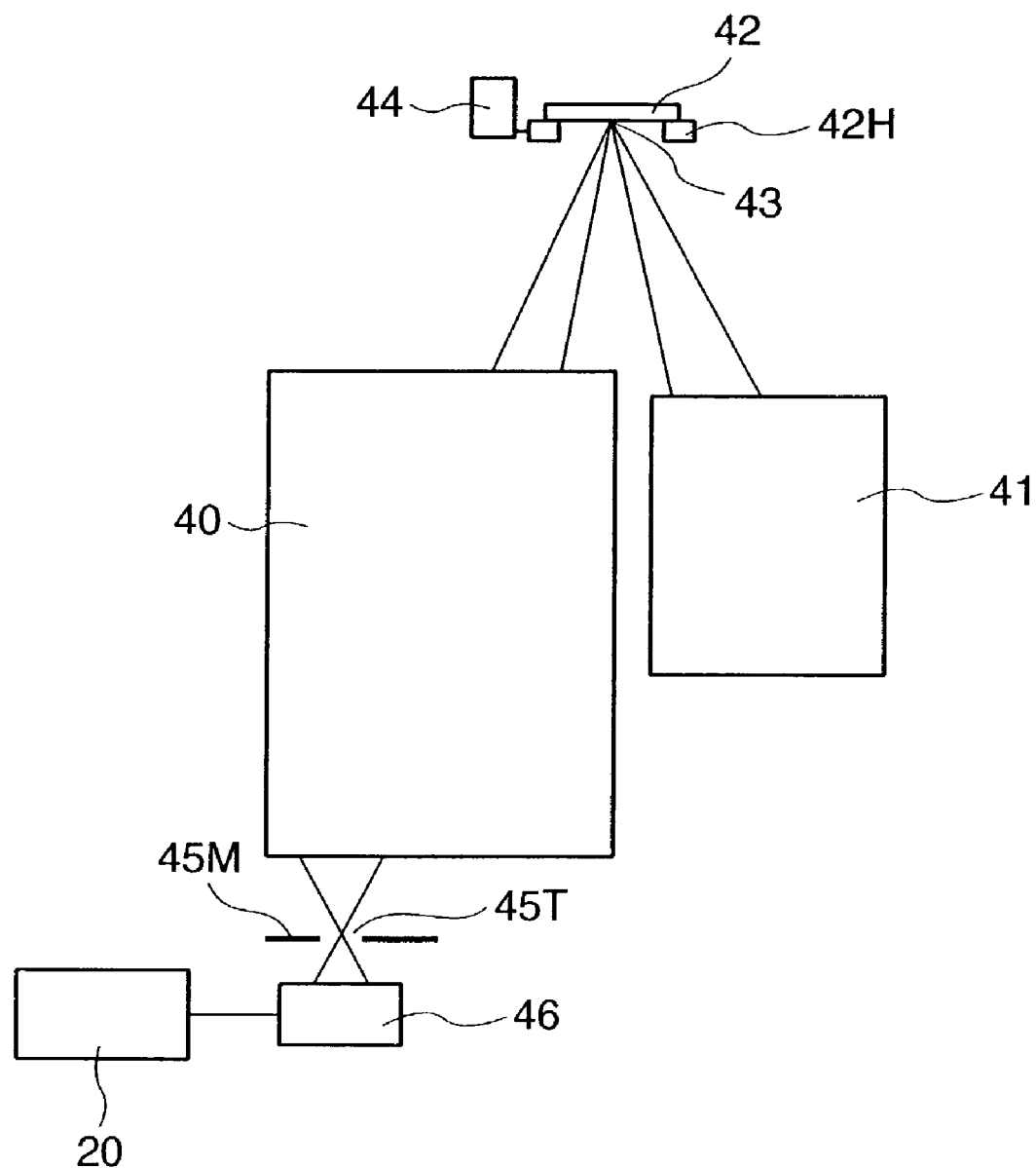
FIG. 13 is a view showing the schematic arrangement of a,projection exposure apparatus according to the third embodiment of the present invention.

FIG. 13 shows the arrangement of a projection exposure apparatus according to the third embodiment of the present invention. In this embodiment, a reflection mask is employed as an optical element. A beam emitted by an illumination system 41 is reflected by a reflecting portion 43 arranged in a mask 42. The beam forms the image of the reflecting portion 43 via a projection optical system 40. A beam emitted by the illumination system 41 is assumed to sufficiently cover the entrance pupil of the projection optical system 40 after it is reflected by the reflecting portion 43. This is realized by, e.g., changing the illumination system 41 to an illumination system with σ=1. The reflecting portion 43 is smaller than the isoplanatic region of the projection optical system 40. The imaging beam passes through a transmission portion 45 formed in a mask 45M arranged near the imaging position of the image of the reflecting portion 43, and reaches the measurement surface of a light intensity distribution detection device 46 where the light intensity distribution is measured. The mask 45M and light intensity distribution detection device 46 are mounted on a wafer stage (not shown). The transmission portion 45T formed in the mask 45M is aligned near the imaging position of the image of the reflecting portion 43. The position on the image sensing surface of the light intensity distribution device 46 is in one-to-one correspondence with the position on the exit pupil of the projection optical system 40. The mask 42 is held by a mask holder 42H and driven by a driving device 44. A reticle stage may be used in place of the driving device 44. Alternatively, the driving device 44 may be provided separately.

In this state, the mask 42 is driven along the object plane (object-side focal plane) of the projection optical system 40, and the light intensity distribution detection device 46 detects changes in intensity at respective pupil positions with driving of the mask 42. The signal processor 20 performs signal processing on the basis of the principle described with reference to FIGS. 3, 4, 5 and 6. As a result, ray aberration ($\epsilon(x,y)$, $\eta(x,y)$) can be obtained.

Wavefront aberration can be obtained by processing of the signal processor 20 on the basis of equations (1) and (2) described above.

The mark 42 is moved to shift the position of the reflecting portion 43 to a different exposure area, and the transmission portion 45T and light intensity distribution detection device 46 are driven to the imaging point of the reflecting portion 43, thereby performing similar measurement. With this operation, the ray aberration and wavefront aberration in the entire exposure area of the projection optical system 40 can be obtained.

As described above, in this embodiment, a reflection optical element is adopted as an optical element which propagates light toward the projection optical system in place of a transmission optical element. This makes it possible to easily measure aberration of the projection optical system even in a projection exposure apparatus using a reflection reticle.

[Modification]

In the above embodiments, the transmission portion 11 or reflecting portion 43 as an optical element which propagates light toward the projection optical system is arranged near the object-side focal plane of the projection optical system. The mask 17M or 45M with the transmission portion 17T or 45T, which passes light having emerged from the optical element and passed through the projection optical system, is arranged near the image-side focal plane of the projection optical system. However, the optical element may be located on the object-side or image-side focal plane of the projection optical system or a plane conjugate to them. Similarly, the mask may be located on the object-side or image-side focal plane of the projection optical system or a plane conjugate to them.

[Aberration Correction Method]

In the projection exposure apparatuses of the preferred embodiments of the present invention described above, a plurality of lenses among a plurality of optical elements which constitute the projection optical system are movable in the optical axis direction and/or a direction perpendicular to the optical axis. One or a plurality of aberrations (particularly Seidel's five aberrations) in the optical system can be corrected or optimized by moving one or a plurality of lenses by an aberration adjustment driving system (not shown) on the basis of aberration information obtained by using the above-mentioned embodiments. A means for adjusting the aberration of the projection optical system includes not only a movable lens but also various known systems such as a movable mirror (when the optical system is a catadioptric system or mirror system), a tiltable plane-parallel plate, a pressure-controllable space, and plane correction by an actuator.

[Semiconductor Device Manufacturing Method]

An embodiment of a semiconductor device manufacturing method using the above-described projection exposure apparatuses will be explained.

Figure 14:
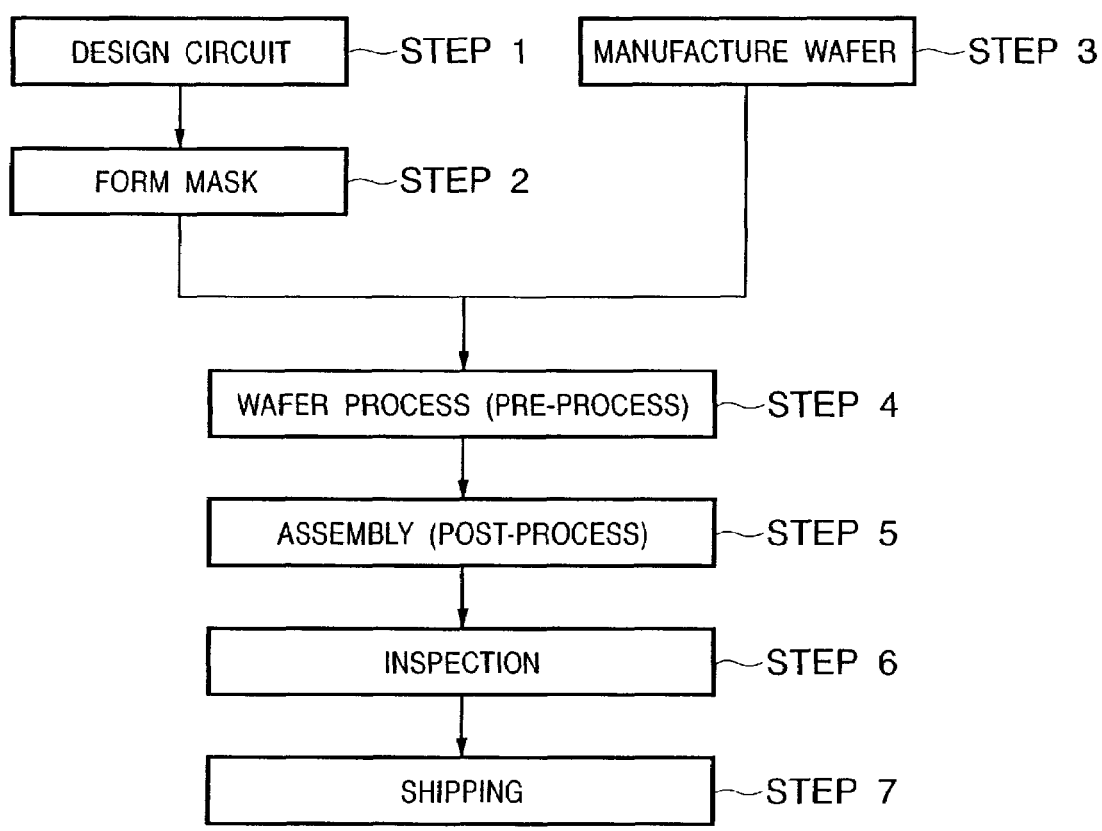
FIG. 14 is a flow chart showing a semiconductor device manufacturing process.

FIG. 14 is a flow chart for explaining the manufacture of a semiconductor device (e.g., a semiconductor chip such as an IC or LSI, a liquid crystal panel, a CCD or the like). In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process), called a pre-process, an actual circuit is formed on the wafer by lithography using a prepared mask and the wafer. Step 5 (assembly), called a post-process, is the step of forming a semiconductor chip by using the wafer formed in step 4, and includes an assembly process (chip encapsulation). In step 6 (inspection), inspections such as an operation confirmation test and a durability test of the semiconductor device manufactured in step 5 are conducted. After these steps, the semiconductor device is completed and shipped (step 7).

Figure 15:
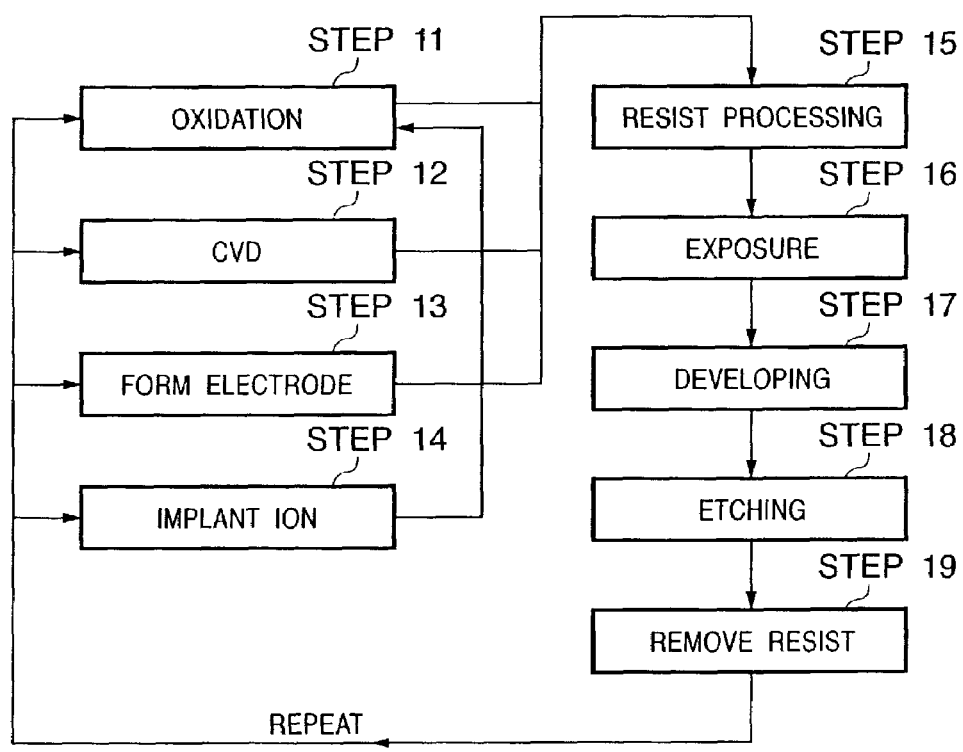
FIG. 15 is a flow chart showing a wafer process.

FIG. 15 is a flow chart showing the wafer process in step 4 of FIG. 14 in detail. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

The manufacturing method of this embodiment can manufacture a high-precision semiconductor device which is difficult to manufacture by a conventional method.

As has been described above, the present invention enables, e.g., measurement of the imaging performance (e.g., wavefront aberration) of a projection optical system in a projection exposure apparatus.

More specifically, a scheme of measuring the intensity of light, having passed through a projection optical system and then the transmission portion of a mask while driving an optical element which propagates the light toward the projection optical system along one focal plane (e.g., an object-side focal plane) of the projection optical system, is adopted. This eliminates the necessity of imparting a high scan driving precision to an optical member.

As many apparently widely different embodiments of the present invention can be made without departing from the spirit and scope thereof, it is to be understood that the invention is not limited to the specific embodiments thereof except as defined in the claims.

What is claimed is:

1. A projection exposure apparatus comprising:
   a projection optical system for projecting a pattern on a substrate;
   a first mask which is arranged on or near an object plane of said projection optical system;
   a second mask which is arranged on or near an image plane of said projection optical system and comprises a single aperture;
   an actuator which drives said first mask or said second mask in a direction perpendicular to an optical axis of said projection optical system; and
   a measurement device for measuring an intensity distribution of light which emerges from said first mask, and passes through said projection optical system and the single aperture of said second mask while said first mask or said second mask is driven, wherein said measurement device is disposed at a point in a plane conjugate to a pupil plane of said projection optical system or a point in a plane apart from said second mask enough to separately detect respective rays emerging from plural points of the pupil plane.

2. The apparatus according to claim 1, further comprising an arithmetic device for calculating aberration of said projection optical system on the basis of a measurement result of said measurement device.

3. The apparatus according to claim 1, further comprising an arithmetic device for calculating ray aberration of said projection optical system on the basis of a measurement result of said measurement device.

4. The apparatus according to claim 1, further comprising an arithmetic device for calculating wavefront aberration of said projection optical system on the basis of a measurement result of said measurement device.

5. The apparatus according to claim 1, wherein said first mask has a transmission portion, said first mask is illuminated by an illumination system and light emerges from the transmission portion toward said projection optical system.

6. The apparatus according to claim 1, wherein said first mask has a reflecting portion, said first mask is illuminated by an illumination system and light emerges from the reflecting portion toward said projection optical system.

7. The apparatus according to claim 1, wherein a region of said first mask, from which light emerges, is smaller than an isoplanatic region of said projection optical system.

8. The apparatus according to claim 1, wherein light which emerges from said projection optical system sufficiently covers a pupil of said projection optical system.

9. A method of measuring aberration of a projection optical system in a projection exposure apparatus for projecting a pattern on a substrate via the projection optical system, the projection exposure apparatus having:
   (i) a projection optical system for projecting a pattern on a substrate,
   (ii) a first mask which is arranged on or near an object plane of the projection optical system, and
   (iii) a second mask which is arranged near an image plane of the projection optical system and comprises a single aperture,
   the method comprising:
      the measurement step of measuring an intensity distribution of light which emerges from the first mask, and passes through the projection optical system and the single aperture of the second mask by a measurement device disposed at a point in a plane conjugate to a pupil plane of the projection optical system or a point in a plane apart from the second mask enough to separately detect respective rays emerging from plural points of the pupil plane, while the first mask or the second mask is driven along one of focal planes of the projection optical system; and
      the arithmetic step of calculating aberration of the projection optical system on the basis of a measurement result obtained in the measurement step.

10. A method of transferring a pattern to a substrate by using a projection exposure apparatus, the projection exposure apparatus having:
   (i) a projection optical system for projecting a pattern on a substrate,
   (ii) a first mask which is arranged on or near an object plane of the projection optical system, and
   (iii) a second mask which is arranged near an image plane of the projection optical system and comprises a single aperture,
   the method comprising:
      the measurement step of measuring an intensity distribution of light which emerges from the first mask, and passes through the projection optical system and the single aperture of the second mask by a measurement device disposed at a point in a plane conjugate to a pupil plane of the projection optical system or a point in a plane apart from the second mask enough to separately detect respective rays emerging from plural points of the pupil plane while the first mask or the second mask is driven along one of focal planes of the projection optical system; and
      the arithmetic step of calculating aberration of the projection optical system on the basis of a measurement result obtained in the measurement step.

11. A method of manufacturing a device by using a projection exposure apparatus, the projection exposure apparatus having:
   (i) a projection optical system for projecting a pattern on a substrate,
   (ii) a first mask which is arranged on or near an object plane of the projection optical system, and
   (iii) a second mask which is arranged near an image plane of the projection optical system and comprises a single aperture,
   the method comprising:
      the measurement step of measuring an intensity distribution of light which emerges from the first mask, and passes through the projection optical system and the single aperture of the second mask by a measurement device disposed at a point in a plane conjugate to a pupil plane of the projection optical system or a point in a plane apart from the second mask enough to separately detect respective rays emerging from plural points of the pupil plane while the first mask or the second mask is driven along one of focal planes of the projection optical system;

the arithmetic step of calculating aberration of the projection optical system on the basis of a measurement result obtained in the measurement step;

the adjustment step of adjusting the projection optical system on the basis of the aberration obtained in the arithmetic step;

the transfer step of transferring a pattern to a photosensitive member of the substrate coated with a photosensitive material by using the projection exposure apparatus in which the projection optical system is adjusted; and the developing step of developing the photosensitive member bearing the pattern.

* * * * *

UNITED STATES PATENT AND TRADEMARK OFFICE
CERTIFICATE OF CORRECTION

PATENT NO. : 6,977,728 B2
DATED : December 20, 2005
INVENTOR(S) : Akihiro Nakauchi It is certified that error appears in the above-identified patent and that said Letters Patent is hereby corrected as shown below:

Column 4,
Line 55, "a,projection" should read -- a projection --.

Column 5,
Line 1, ""testing"," should read -- Testing", --.

Column 7,
Line 37, "230-207," should read -- 203-207, --.

Column 8,
Line 65, "$D+t \times m+2 \times \xi$max." should read -- $=D+t \times m+2 \times \xi$max. --.

Column 9,
Line 56, "sions," should read -- sion. --.

Column 11,
Line 34, "is-scanned" should read -- is scanned --.

Signed and Sealed this

Twenty-third Day of May, 2006

JON W. DUDAS
*Director of the United States Patent and Trademark Office*